United States Patent
Wada et al.

[11] Patent Number: 6,028,874
[45] Date of Patent: Feb. 22, 2000

[54] SEMICONDUCTOR LASER

[75] Inventors: Mitsugu Wada; Toshiaki Fukunaga, both of Kanagawa-ken, Japan

[73] Assignee: Fuji Photo Film Co., Ltd., Kanagawa-ken, Japan

[21] Appl. No.: 08/877,958

[22] Filed: Jun. 17, 1997

[30] Foreign Application Priority Data

Jun. 17, 1996 [JP] Japan .................................. 8-155691
Jul. 17, 1996 [JP] Japan .................................. 8-187353

[51] Int. Cl.$^7$ ....................................................... H01S 3/19
[52] U.S. Cl. ............................................. 372/45; 372/46
[58] Field of Search ........................ 372/45, 46; 437/129

[56] References Cited

U.S. PATENT DOCUMENTS 5,363,392  11/1994  Kasukawa ................................. 372/45
5,496,767  3/1996  Yoshida .................................. 437/129
5,734,671  3/1998  Katsuyama ............................... 372/46

FOREIGN PATENT DOCUMENTS 0 660 472  6/1995  European Pat. Off. .
2 293 045  3/1996  United Kingdom .

OTHER PUBLICATIONS

"Appl. Phys. Lett." 62(1993) 1644 (Apr.).
"IEEE Journal of Selected Topics in Quantum Electronics" vol. 1, No. 2(1995) p. 712 (Jun.).
"IEEE Journal of Quantum Electronics" QE–27(1991) p. 1483 (Jun.).

M. SAGAWA et al., "High–Power Highly–reliable Operation of 0.98–um InGaAs–InGaP Strain–Compensated Single–Quantum–Well Lasers with Tensile–Strained InGaAsP Barriers" IEEE JOURNAL OF SELECTED TOPICS IN QUANTUM ELECTRONICS, vol. 1, no. 2, 1 Jun. 1995, pps. 189–195.

G. ZHANG et al., "Strain–compensated inGaAs/GaAsP/GaInAsP/GaInP quantum well lasers (0.98 um) grown by gas–source molecular beam epitaxy", APPLIED PHYSICS LETTERS, vol. 62, no. 14, 5 Apr. 1993, pp. 1644–1646.

*Primary Examiner*—Rodney Bovernick
*Assistant Examiner*—Yisun Song
*Attorney, Agent, or Firm*—Sughrue, Mion, Zinn, Macpeak & Seas, PLLC

[57] ABSTRACT

A III-V group semiconductor laser includes a first clad layer, a first optical waveguide layer, a first barrier layer, an active layer, a second barrier layer, a second optical waveguide layer and a second clad layer formed in this order on a GaAs substrate which is a III-V group compound semiconductor. Each of the first and second clad layers and the first and second optical waveguide layers is of a composition which matches with the GaAs substrate in lattice. The active layer is of a composition which induces compressive strain on the GaAs substrate. Each of the first and second barrier layers is of a composition which induces tensile strain on the GaAs substrate, thereby compensating for the compressive strain induced in the active layer. The ratio of V group elements contained in the first optical waveguide layer is the same as that in the first barrier layer, and the ratio of V group elements contained in the second optical waveguide layer is the same as that in the second barrier layer.

4 Claims, 3 Drawing Sheets

SEMICONDUCTOR LASER

BACKGROUND OF THE INVENTION

1. Field of the Invention

This invention relates to a semiconductor laser, and more particularly to compositions of semiconductor layers of a semiconductor laser.

2. Description of the Related Art

As semiconductor lasers emitting a laser beam of a wavelength of 0.98 $\mu$m-band, there has been proposed as described, for instance, in "Appl. Phys. Lett., 62(1993) 1644" those comprising an n-InGaP clad layer, an $In_{x3}Ga_{1-x3}As_{1-y3}P_{y3}$ optical waveguide layer, a $GaAs_{1-y2}P_{y2}$ tensile strain barrier layer, an $In_{x1}Ga_{1-x1}As$ compressive strain quantum well layer, a $GaAs_{1-y2}P_{y2}$ tensile strain barrier layer, an $In_{x3}Ga_{1-x3}As_{1-y3}P_{y3}$ optical waveguide layer, a p-InGaP clad layer and a p-GaAs capping layer formed on an n-GaAs substrate.

However this structure is disadvantageous in the following points. That is, in crystal growth by MOCVD (metal organic chemical vapor deposition) method, a rapid substitution of As on P takes place upon switching of hydrogenated V group gases ($PH_3$, $AsH_3$) in the course of growth of the tensile strain barrier layer on the optical waveguide layer or growth reverse thereto, which makes unstable the state of the crystal faces. Accordingly it is impossible to generate the interfaces at a high quality with a stable reproducibility and the quality of crystals grown on the interfaces deteriorates.

Further as semiconductor lasers emitting a laser beam of a wavelength of 0.6 to 0.7 $\mu$m, there have been widely known those comprising an n-InGaAlP clad layer, an i-InGaAlP optical waveguide layer, a multiquantum well active layer consisting of an InGaAlP barrier layer and an InGaP tensile strain quantum well layer, an i-InGaAlP optical waveguide layer, a p-InGaAlP clad layer and a p-GaAs capping layer formed on an n-GaAs substrate in this order. See, for instance, "IEEE Journal of Selected Topics in Quantum Electronics, Vol.1, No.2(1995)pp.712".

However this structure is disadvantageous in the following points as described in "IEEE Journal of Quantum Electronics, QE-27(1991)pp.1483". That is, growth of InGaP greatly depends upon the orientation on the substrate and the condition of growth and accordingly it is impossible to obtain good crystals with a stable reproducibility. Further since the active layer has tensile strain, high reliability cannot be obtained.

Further in crystal growth by MOCVD (metal organic chemical vapor deposition) method, a rapid substitution of As on P takes place upon switching of hydrogenated V group gases ($PH_3$, $AsH_3$) in the course of growth of the clad layer/optical waveguide layer interfaces and the barrier layer/active layer interfaces or growth reverse thereto, which makes unstable the state of the crystal faces. Accordingly it is impossible to generate the interfaces at a high quality with a stable reproducibility and the quality of crystals grown on the interfaces deteriorates.

SUMMARY OF THE INVENTION

In view of the foregoing observations and description, the primary object of the present invention is to provide a III-V group semiconductor laser of a strain quantum well type which emits a laser beam of a wavelength of 0.9 to 1.1 $\mu$m and is highly reliable even during oscillation at a high power.

Another object of the present invention is to provide a strain quantum well type semiconductor laser which emits a laser beam of a wavelength of 0.6 to 0.8 $\mu$m and is highly reliable even during oscillation at a high power.

In accordance with a first aspect of the present invention, there is provided a III-V group semiconductor laser comprising a first clad layer, a first optical waveguide layer, a first barrier layer, an active layer, a second barrier layer, a second optical waveguide layer and a second clad layer formed in this order on a GaAs substrate which is a III-V group compound semiconductor, wherein the improvement comprises that each of the first and second clad layers and the first and second optical waveguide layers is of a composition which matches with the GaAs substrate in lattice, said active layer is of a composition which induces compressive strain on the GaAs substrate, each of the first and second barrier layers is of a composition which induces tensile strain on the GaAs substrate, thereby compensating for the compressive strain induced in the active layer, the ratio of V group elements contained in the first optical waveguide layer is the same as that in the first barrier layer, and the ratio of V group elements contained in the second optical waveguide layer is the same as that in the second barrier layer.

Preferably, the active layer is of a composition $In_{x1}Ga_{1-x1}As$ ($0 \leq x1 \leq 1$), each of the first and second barrier layers is of a composition $In_{x2}Ga_{1-x2}As_{1-y}P_y$ ($0.00 \leq x2 \leq 0.23$, $0.04 \leq y \leq 0.50$), and each of the first and second optical waveguide layers is of a composition $In_{x3}Ga_{1-x3}As_{1-y}P_y$ ($x2<x3 \leq 0.25$).

In accordance with a second aspect of the present invention, there is provided a III-V group semiconductor laser of a separate confinement heterostructure comprising a first conduction type clad layer, a first optical waveguide layer, a first barrier layer, a quantum well active layer, a second barrier layer, a second optical waveguide layer and a second conduction type clad layer formed on a GaAs substrate in this order, wherein the improvement comprises that said quantum well active layer is of a composition which includes As and P and induces compressive strain on the GaAs substrate, each of the first and second barrier layers is of a composition which includes In, Ga, Al, As and P and induces compressive strain on the GaAs substrate, thereby compensating for the tensile strain induced in the active layer, each of the first and second optical waveguide layers is of a composition which includes In, Ga, Al, As and P and matches with the GaAs substrate in lattice, each of the first conduction type clad layer and the second conduction type clad layer is of a composition which matches with the GaAs substrate in lattice, and the ratios of As to P contained in the quantum well active layer, the first and second barrier layers, and the first and second optical waveguide layers are equal to each other.

Preferably the quantum well active layer is of a composition $In_{x1}Ga_{1-x1}As_{1-y1}P_{y1}$ ($0.0 \leq x1 \leq 1.0$, $0.1 \leq y1 \leq 0.9$) with the values of x1 and y1 satisfying the condition $(a_{GaAs}-a)/a_{GaAs} \geq 0.3(\%)$ wherein $a_{GaAs}$ represents the lattice constant of said GaAs and a represents the bulk lattice constant of the $In_{x1}Ga_{1-x1}As_{1-y1}P_{y1}$, each of the first and second barrier layers is of a composition $In_{x2}(Ga_{1-z2}$ $Al_{z2})_{1-x2}$ $As_{1-y2}P_{y2}$ (0.0≦x2≦1.0, y2=y1, 0.0≦z2≦1.0), each of the first and second optical waveguide layers is of a composition $In_{x3}$ $(Ga_{1-z3}Al_{z3})_{1-x3}As_{1-y3}P_{y3}$ (0.0≦x3≦1.0, y3=y1, 0.0≦z3≦1.0), and each of the first conduction type clad layer and the second conduction type clad layer is of a composition $In_{x3}(Ga_{1-z4}Al_{z4})_{1-x4}As_{1-y4}P_{y4}$ (0.0≦x4≦1.0, 0.0≦y4≦0.9, 0.0≦z4≦1.0).

It should be noted that terms "first conduction type" and "second conduction type" are used for distinguishing an n-type conductive structure and a p-type conductive structure from each other in this specification. For example, when the first conduction type is n-type, the second conduction type is p-type and vice versa.

In the semiconductor laser in accordance with the first aspect of the present invention, since the compressive strain of the active layer is compensated for by the tensile-strained barrier layers, reliability of the device is improved.

Further since the ratio of V group elements contained in the first optical waveguide layer is the same as that in the first barrier layer and the ratio of V group elements contained in the second optical waveguide layer is the same as that in the second barrier layer, hydrogenated V group gases need not be changed when forming the optical waveguide layer and the barrier layer by MOCVD method, and accordingly the growth interruption time at the interfaces can be shortened and a laser structure can be produced without generation of a defect in the interfaces. As a result, the quality of crystals grown at the interface and on the interface can be improved and reliability of the device can be improved.

Generally when determining the composition of the semiconductor layers of a semiconductor laser, a composition diagram such as shown in FIG. 2 ("III-V group semiconductor mixed crystal", Corona Shuppan) is used. Equi-band gap lines (solid line), equi-lattice constant lines (broken line) and miscibility gap lines at various growth temperatures (chained line) are also shown in FIG. 2. For example, each of the optical waveguide layers and the clad layers is of a composition which matches with the GaAs substrate in lattice, that is, of a composition which falls on the equi-lattice constant line of 0.0%, and the value of ratio of the elements is determined according to the miscibility gap which depends on the growth temperature. In the semiconductor laser in accordance with the first aspect of the present invention, since the ratio of V group elements contained in the optical waveguide layer is the same as that in the barrier layer and the ratio of III group element x2 in the barrier layer is smaller than that x3 in the optical waveguide layer, the band gap of the tensile-strained barrier layer is higher than that of the optical waveguide layer as can be seen from FIG. 2, and accordingly the light emitting efficiency and the threshold current less depend on the temperature.

In the semiconductor laser in accordance with the second aspect of the present invention, since the active layer contains no Al and the tensile strain of the quantum well active layer is compensated for by the compression-strained barrier layers, reliability of the device is improved.

Further since the ratio of V group elements contained in the optical waveguide layers, the barrier layers and the active layer are equal to each other, hydrogenated V group gases need not be changed when forming these layers by MOCVD method, whereby the quality of crystals grown at the interface and on the interface can be improved and at the same time the growth interruption time at the interfaces between the optical waveguide layers and the barrier layers can be shortened, whereby a laser structure can be produced without generation of defect in the interfaces. As a result, a laser which is highly reliable even during oscillation at a high power can be provided.

Further, when the aforesaid preferable compositions of the layers are employed, the band gap of the compression-strained barrier layer becomes higher than that of the optical waveguide layer, and the light emitting efficiency and the threshold current come to less depend on the temperature.

DESCRIPTION OF THE PREFERRED EMBODIMENT

Figure 1:
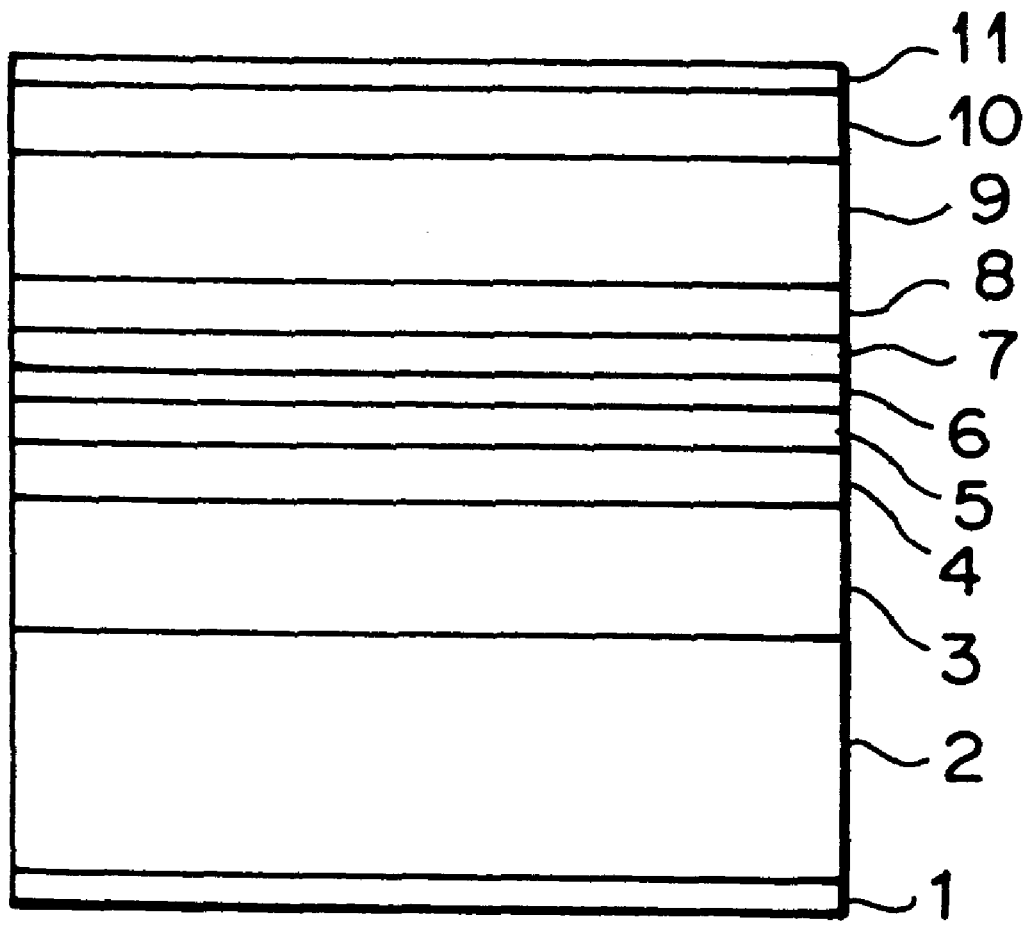
FIG. 1 is a schematic cross-sectional view of a semiconductor laser in accordance with a first embodiment of the present invention.
Figure 2:
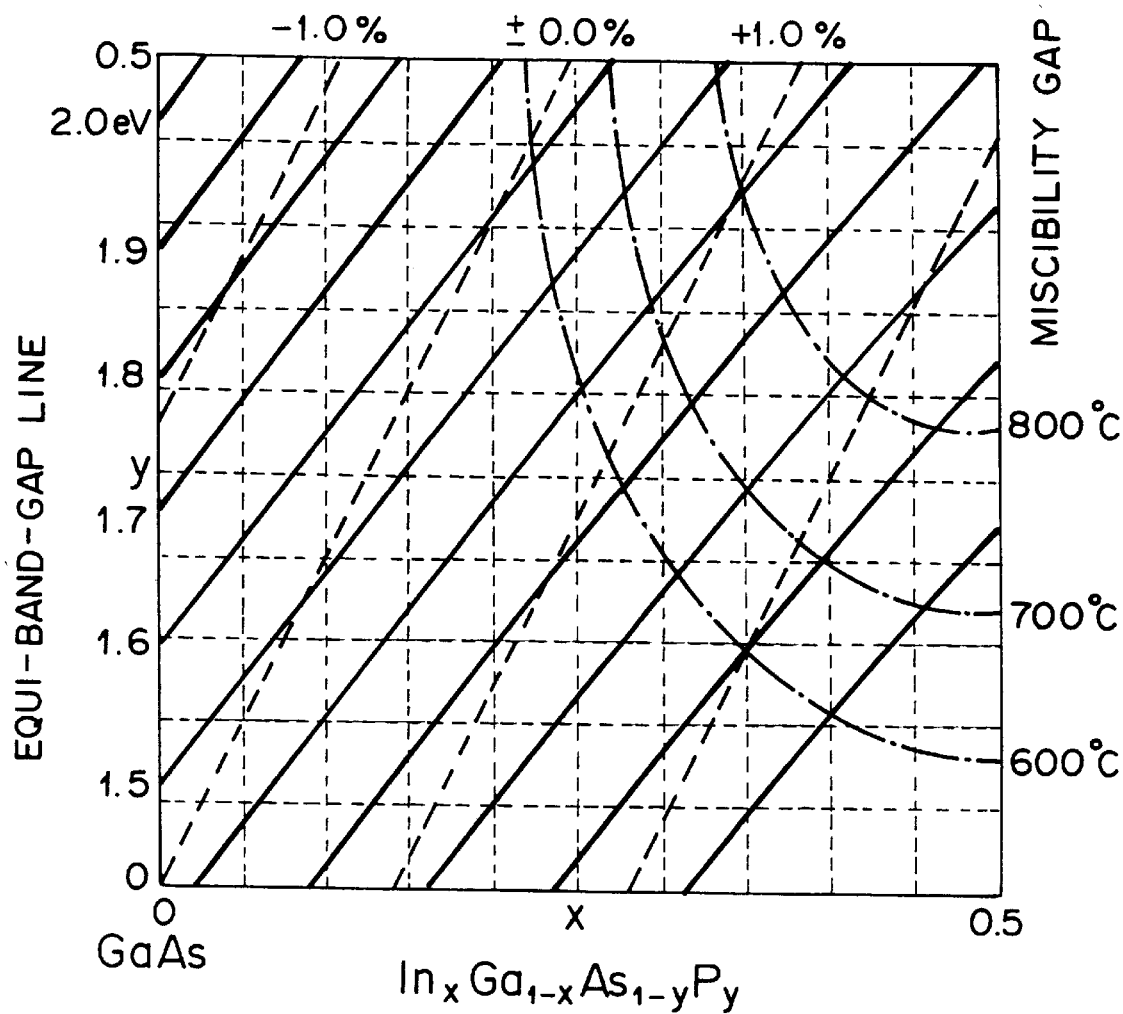
FIG. 2 is a composition diagram for determining the composition of the semiconductor layers of the semiconductor laser of the first embodiment.

The semiconductor laser shown in FIG. 1 is in accordance with a first embodiment of the present invention and is produced in the following manner. By use of trimethyl gallium (TMG) and trimethyl indium (TMI) as III group organic metals and $AsH_3$ and $PH_3$ as hydrogenated V group gases, an n-$In_{x4}Ga_{1-x4}As_{1-y4}P_{y4}$ clad layer 3 (0≦x4≦1, 0≦y4≦1), an $In_{x3}Ga_{1-x3}As_{1-y}P_y$ optical waveguide layer 4 (x2≦x3≦0.25, 0.04≦y≦0.50), an $In_{x2}Ga_{1-x2}As_{1-y}P_y$ tensile strain barrier layer 5, an $In_{x1}Ga_{1-x1}As$ compressive strain quantum well active layer 6 (0≦x1≦1), an $In_{x2}Ga_{1-x2}As_{1-y}P_y$ tensile strain barrier layer 7, an $In_{x3}Ga_{1-x3}As_{1-y}P_y$ optical waveguide layer 8, a p-$In_{x4}Ga_{1-x4}As_{1-y4}P_{y4}$ clad layer 9 and a p-GaAs contact layer 10 are grown successively on an n-GaAs substrate 2 in this order by a MOCVD apparatus. The composition of each layer is determined according to the composition diagram shown in FIG. 2 taking into account the miscibility gap corresponding to growth at 700° C.

Each of the clad layers 3 and 9 and the optical waveguide layers 4 and 8 is of a composition which matches with the GaAs substrate 2 in lattice. The thickness of each of the tensile strain barrier layers 5 and 7 for compensating for strain of the quantum well active layer 6 is set so that a defect such as dislocation is not generated during crystal growth and the strain of each of the tensile strain barrier layers 5 and 7 is set so that the compressive strain of the quantum well active layer 6 is compensated for by the tensile strain of both the barrier layers 5 and 7 on opposite sides of the active layer 6. Since the ratios of As to P contained in the barrier layers and the optical waveguide layers are equal to each other, $AsH_3$ and $PH_3$ gases need not be changed during crystal growth by MOCVD, and heterointerfaces can be stably formed.

The semiconductor laser of this embodiment is completed by subsequently forming metal electrodes 1 and 11 respectively on the substrate 2 and the contact layer 10.

Though the semiconductor laser of this embodiment is of a simple double heterostructure, the structure may be further processed by the normal photolithography and/or etching into a semiconductor laser with index optical waveguide mechanism, a semiconductor laser with diffraction grating, an optical integrated circuit and the like.

Though the semiconductor laser of this embodiment is of a so-called SCH-SQW structure having a single quantum well and a pair of optical waveguide layers of the same compositions, a multiquantum well structure (MQW) having a plurality of quantum wells may be employed in place of SQW.

The oscillating wavelength band of the semiconductor laser can be controlled in the range of 900 nm to 1100 nm by the $In_{x1}Ga_{1-x1}As$ active layer.

The clad layers may be of InGaP or AlGaAs which matches with the GaAs substrate in lattice. Further crystal growth may be effected also by a molecular beam epitaxial growth method using solid or gaseous raw materials.

Figure 3:
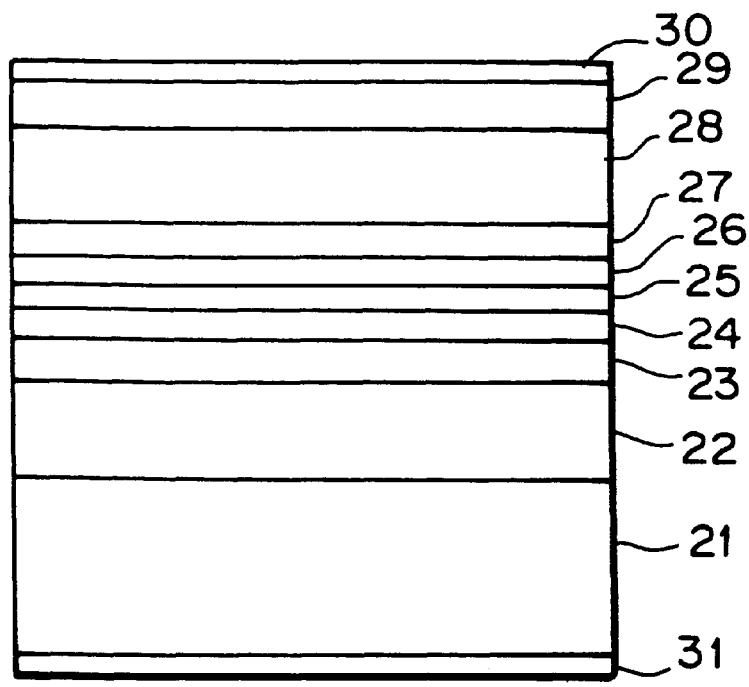
FIG. 3 is a schematic cross-sectional view of a semiconductor laser in accordance with a second embodiment of the present invention.

The semiconductor laser shown in FIG. 3 is in accordance with a second embodiment of the present invention and is produced in the following manner. An $n-In_{x4}(Ga_{1-z4}Al_{z4})_{1-x4}As_{1-y4}P_{y4}$ clad layer 22, an $In_{x3}(Ga_{1-z3}Al_{z3})_{1-x3}As_{1-y}P_y$ optical waveguide layer 23, an $In_{x2}(Ga_{1-z2}Al_{z2})_{1-x2}As_{1-y}P_y$ compressive strain barrier layer 24, an $In_{x1}Ga_{1-x1}As_{1-y}P_y$ tensile strain quantum well active layer 25, an $In_{x2}(Ga_{1-z2}Al_{z2})_{1-x2}As_{1-y}P_y$ compressive strain barrier layer 26, an $In_{x3}(Ga_{1-z3}Al_{z3})_{1-x3}As_{1-y}P_y$ optical waveguide layer 27, a $p-In_{x4}(Ga_{1-z4}Al_{z4})_{1-x4}As_{1-y4}P_{y4}$ clad layer 28 and a p-GaAs contact layer 29 are grown successively on an n-GaAs substrate 21 in this order by a MOCVD method. The semiconductor laser of this embodiment is completed by subsequently forming a p-side electrode 30 and an n-side electrode 31 respectively on the contact layer 29 and the substrate 21.

Each of the clad layers 22 and 28 and the optical waveguide layers 23 and 27 is of a composition which matches with the GaAs substrate 21 in lattice. The thickness of each of the compressive strain barrier layers 24 and 26 is set so that a defect such as a dislocation is not generated during crystal growth and the strain of each of the compressive strain barrier layers 24 and 26 is set so that the tensile strain of the quantum active layer 25 is compensated for by the compressive strain of both the barrier layers 24 and 26 on opposite sides of the active layer 25. Since the ratios of As to P contained in the active layer 25, the barrier layers 24 and 26 and the optical waveguide layers 23 and 27 are equal to each other, $AsH_3$ and $PH_3$ gases need not be changed during crystal growth by MOCVD, and heterointerfaces can be stably formed.

Though the semiconductor laser of this embodiment is of a simple double heterostructure, the structure may be provided with an insulating film stripe to form a gain waveguide stripe laser or further processed by the normal photolithography and/or etching into a semiconductor laser with index optical waveguide mechanism, a semiconductor laser with diffraction grating, an optical integrated circuit and the like.

Figure 4:
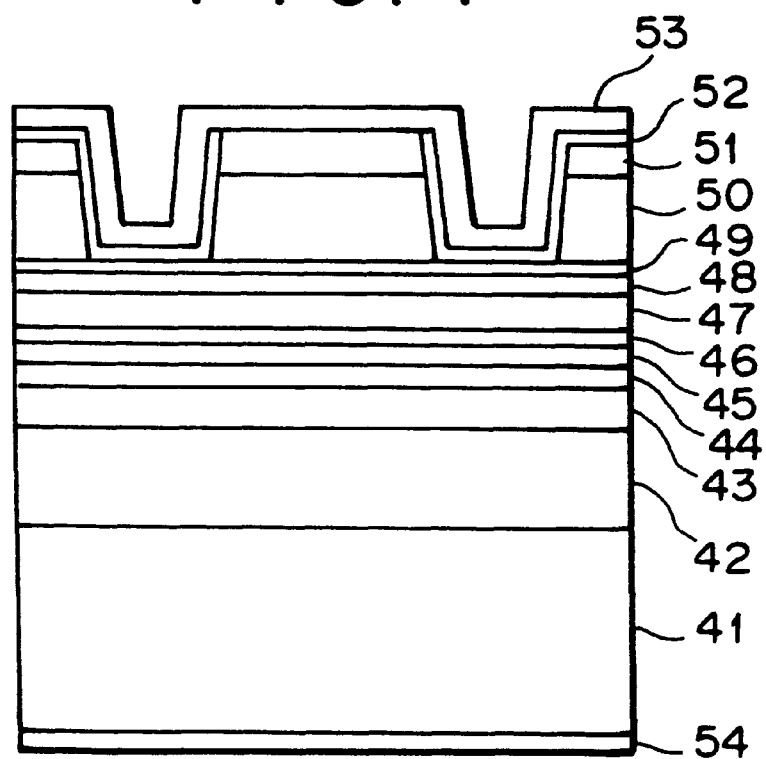
FIG. 4 is a schematic cross-sectional view of a semiconductor laser in accordance with a third embodiment of the present invention.

The semiconductor laser shown in FIG. 4 is in accordance with a third embodiment of the present invention and is produced in the following manner. An $n-In_{x4}(Ga_{1-z4}Al_{z4})_{1-x4}As_{1-y4}P_{y4}$ clad layer 42, an $In_{x3}(Ga_{1-z3}Al_{z3})_{1-x3}As_{1-y}P_y$ optical waveguide layer 43, an $In_{x2}(Ga_{1-z2}Al_{z2})_{1-x2}As_{1-y}P_y$ compressive strain barrier layer 44, an $In_{x1}Ga_{1-x1}As_{1-y}P_y$ tensile strain quantum well active layer 45, an $In_{x2}(Ga_{1-z2}Al_{z2})_{1-x2}As_{1-y}P_y$ compressive strain barrier layer 46, an $In_{x3}(Ga_{1-z3}Al_{z3})_{1-x3}As_{1-y}P_y$ optical waveguide layer 47, a $p-In_{x4}(Ga_{1-z4}Al_{z4})_{1-x4}As_{1-y4}P_{y4}$ first upper clad layer 48, a $p-In_{x4}(Ga_{1-z4}Al_{z4})_{1-x4}P_y$ etching stopping layer 49 a $p-In_{x4}(Ga_{1-z4}Al_{z4})_{1-x4}As_{1-y4}P_{y4}$ second upper clad layer 50 and a p-GaAs contact layer 51 are grown successively on an n-GaAs substrate 41 in this order by a MOCVD method. Then an insulating layer (not seen in FIG. 4) such as of $SiO_2$ is formed thereon.

Each of the clad layers 42, 48 and 50 and the optical waveguide layers 43 and 47 is of a composition which matches with the GaAs substrate 41 in lattice. The thickness of each of the compressive strain barrier layers 44 and 46 is set so that a defect such as dislocation is not generated during crystal growth and the strain of each of the compressive strain barrier layers 44 and 46 is set so that the tensile strain of the active layer 45 is compensated for by the compressive strain of both the barrier layers 44 and 46 on opposite sides of the active layer 45.

Then the insulating layer is removed by a normal lithography in a pattern of pair of parallel stripes spaced from each other by 6 μm, and wet etching is carried out using the remaining part of the insulating layer as a mask to remove the second upper clad layer 50 and the contact layer 51, thereby forming a ridge stripe. When sulfuric acid and hydrogen peroxide are used as the etching solution, etching is automatically stopped at the etching stopping layer 49. The thickness of the first upper clad layer 48 is such that refraction waveguide in a single basic mode can be achieved to a high output power in an optical waveguide of a width equal to that of the ridge stripe.

Thereafter an insulating layer 52 is formed and the part of the insulating layer 52 on the ridge stripe is removed by a normal lithography and a p-side electrode 53 is formed. Further the substrate 41 is ground and an n-side electrode 54 is formed.

Then the piece thus obtained is cleft to form resonator end faces, and the resonator end faces are provided with a high reflective coating and a low reflecting coating, thereby making the piece a semiconductor laser element. The semiconductor laser element can emit a high output power laser beam maintaining a single transverse mode.

Though, in the semiconductor laser in accordance with the third embodiment of the present invention, the second upper clad layer 50 is of a composition $p-In_{x4}(Ga_{1-z4}Al_{z4})_{1-x4}As_{1-y4}P_{y4}$, it may be of the same composition as the etching stopping layer 49. When the contact layer 51 is etched with sulfuric acid and hydrogen peroxide and the second upper clad layer 50 is etched with a chlorine solution, etching is automatically stopped at the first upper clad layer 48. Then by the process described above, a refraction strip laser of a ridge structure can be obtained.

With the etching stopping mechanism described above, a refraction strip laser of an embedded structure can be obtained through three step growth of crystals.

Though the semiconductor lasers of the second and third embodiments are of a so-called SCH-SQW structure having a single quantum well and a pair of optical waveguide layers of the same composition, a multiquantum well structure (MQW) having a plurality of quantum wells may be employed in place of SQW.

The oscillating wavelength band of the semiconductor lasers can be controlled in the range of 630 nm to 800 nm by virtue of the $In_{x1}Ga_{1-x1}As_{1-y}P_y$ ($0.01 \leq y \leq 0.9$) tensile-strained quantum well active layer (the amount of strain of not smaller than 0.3%).

Further crystal growth may be effected also by a molecular beam epitaxial growth method using solid or gaseous raw materials.

The semiconductor laser in accordance with the second or third aspect of the present invention can be used as a light source for a high speed information/image processing, communication, measurement, medical use, printing or the like.

What is claimed is:

1. A III-V group semiconductor laser comprising:
  a first clad layer,
  a first optical waveguide layer,
  a first barrier layer,
  an active layer,
  a second barrier layer,
  a second optical waveguide layer, and
  a second clad layer, directly formed on each other on a GaAs substrate which is a III-V group compound semiconductor, wherein each of the first and second clad layers and the first and second optical waveguide layers is of a composition which matches with the GaAs substrate in lattice,
  said active layer is of a composition which induces compressive strain on the GaAs substrate,
  each of the first and second barrier layers is of a composition which induces tensile strain on the GaAs substrate, thereby compensating for the compressive strain induced in the active layer,
  the ratio of V group elements contained in the first optical waveguide layer is the same as that in the first barrier layer, and
  the ratio of V group elements contained in the second optical waveguide layer is the same as that in the second barrier layer.

2. A III-V group semiconductor laser as defined in claim 1 in which
  the active layer is of a composition $In_{x1}Ga_{1-x1}As$ ($0 \leq x1 \leq 1$),
  each of the first and second barrier layers is of a composition $In_{x2}Ga_{1-x2}As_{1-y}P_y$ ($0.00 \leq x2 \leq 0.23$, $0.04 \leq y \leq 0.50$), and
  each of the first and second optical waveguide layers is of a composition $In_{x3}Ga_{1-x3}As_{1-y}P_y$ ($x2 < x3 \leq 0.25$).

3. A III-V group semiconductor laser of a separate confinement heterostructure comprising a first conduction type clad layer, a first optical waveguide layer, a first barrier layer, a quantum well active layer, a second barrier layer, a second optical waveguide layer and a second conduction type clad layer formed on a GaAs substrate in this order, wherein
  said quantum well active layer is of a composition which includes As and P and induces tensile strain on the GaAs substrate,
  each of the first and second barrier layers is of a composition which includes In, Ga, Al, As and P and induces compressive strain on the GaAs substrate, thereby compensating for the tensile strain induced in the active layer,
  each of the first and second optical waveguide layers is of a composition which includes In, Ga, Al, As and P and matches with the GaAs substrate in lattice,
  each of the first conduction type clad layer and the second conduction type clad layer is of a composition which matches with the GaAs substrate in lattice, and
  the ratios of As to P contained in the quantum well active layer, the first and second barrier layers, and the first and second optical waveguide layers are equal to each other.

4. A III-V group semiconductor laser as defined in claim 3 in which
  the quantum well active layer is of a composition $In_{x1}Ga_{1-x1}As_{1-y1}P_{y1}$ ($0.0 \leq x1 \leq 1.0$, $0.1 \leq y1 \leq 0.9$) with the values of x1 and y1 satisfying the condition $(a_{GaAs} - a)/a_{GaAs} \geq 0.3(\%)$ wherein $a_{GaAs}$ represents the lattice constant of said GaAs and a represents the bulk lattice constant of the $In_{x1}Ga_{1-x1}As_{1-y1}P_{y1}$,
  each of the first and second barrier layers is of a composition $In_{x2}(Ga_{1-z2}Al_{z2})_{1-x2}As_{1-y2}P_{y2}$ ($0.0 < x2 < 1.0$, $y2=y1$, $0.0 < z2 < 1.0$),
  each of the first and second optical waveguide layers is of a composition $In_{x3}(Ga_{1-z3}Al_{z3})_{1-x3}As_{1-y3}P_{y3}$ ($0.0 < x3 < 1.0$, $y3=y1$, $0.0 < z3 < 1.0$), and
  each of the first conduction type clad layer and the second conduction type clad layer is of a composition $In_{x4}(Ga_{1-z4}Al_{z4})_{1-x4}As_{1-y4}P_{y4}$ ($0.0 \leq x4 \leq 1.0$, $0.0 \leq y4 \leq 0.9$, $0.0 \leq z4 \leq 1.0$).

* * * * *